US008825433B2

(12) United States Patent
Baalaji et al.

(10) Patent No.: US 8,825,433 B2
(45) Date of Patent: Sep. 2, 2014

(54) AUTOMATIC GENERATION OF VALID AT-SPEED STRUCTURAL TEST (ASST) TEST GROUPS

(75) Inventors: Konda R. Baalaji, Karnataka (IN); Malede W. Berhanu, Colchester, VT (US); Vikram Iyengar, Pittsburgh, PA (US); Douglas C. Pricer, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 13/241,651

(22) Filed: Sep. 23, 2011

(65) Prior Publication Data

US 2013/0080108 A1 Mar. 28, 2013

(51) Int. Cl.
*G06F 19/00* (2011.01)
*G01R 31/28* (2006.01)
(52) U.S. Cl.
USPC .......................................... 702/123; 714/734
(58) Field of Classification Search
USPC ......... 702/123, 108, 117, 119–120, 125, 182,
702/185; 326/93–94, 96; 714/703, 707,
714/724, 731, 734, 744, 789, 798
See application file for complete search history.

(56) References Cited

U.S. PATENT DOCUMENTS

| | | | |
|---|---|---|---|
| 6,327,684 B1 | 12/2001 | Nadeau-Dostie et al. | |
| 7,134,061 B2 | 11/2006 | Agashe et al. | |
| 7,155,651 B2 | 12/2006 | Nadeau-Dostie et al. | |
| 7,380,189 B2 | 5/2008 | Konuk | |
| 7,500,164 B2 | 3/2009 | Chelstrom et al. | |
| 2006/0190754 A1 | 8/2006 | Dargelas et al. | |
| 2008/0282110 A1 | 11/2008 | Guettaf | |
| 2009/0083594 A1 | 3/2009 | Chelstrom et al. | |
| 2009/0119629 A1 | 5/2009 | Grise et al. | |
| 2010/0218062 A1 | 8/2010 | Wang et al. | |
| 2012/0150473 A1* | 6/2012 | Grise et al. .................... 702/117 |

FOREIGN PATENT DOCUMENTS

KR 2006-0095283 8/2006

OTHER PUBLICATIONS

Iyengar et al., A Flexible and Scalable Methodology for GHz-Speed Structural Test, Jul. 24-28, 2006, DAC 2006, San Francisco, California, pp. 314-319.*
Beck et al., Logic Design for On-Chip Test Clock Generation-Implementation Details and Impact on Delay Test Quality, 2005, Proceedings of the Design, Automation and Test in Europe Conference and Exhibition, 6 pp.*

(Continued)

*Primary Examiner* — Toan Le
(74) *Attorney, Agent, or Firm* — Michael Le Strange; Roberts Mlotkowski Safran & Cole, P.C.

(57) ABSTRACT

A method and system is provided for automatically generating valid at speed structural test (ASST) test groups. The method includes loading a netlist for an integrated circuit into a processor. The method further includes determining a plurality of clock domain crossings between a plurality of clock domains within the integrated circuit. The method further includes generating a first test group. The method further includes adding a first clock domain of the plurality of clock domains to the first test group. The method further includes adding a second clock domain of the plurality of clock domains to the first test group when the second clock domain does not have a clock domain crossing into the first clock domain.

20 Claims, 4 Drawing Sheets

(56) References Cited

OTHER PUBLICATIONS

"Wrapper cell for asyncronous domain crossings in at-speed structured test", IBM, IPCOM00131729D, IP.com, Nov. 17, 2005, 3 pages.

Iyengar, V., et al., "At-Speed Structural Test for High-Performance ASICs", International Test Conference, IEEE, 2006, pp. 1-10.

Leong, C., et al., "Built-in Clock Domain Crossing (CDC) Test and Diagnosis in GALS Systems", Design and Diagnostics of Electronic Circuits and Systems (DDECS), IEEE, 2010, pp. 72-77.

"Scan Clock Distribution Using One Single Clock Input Pin", IBM, IPCOM000171318D, IP.com, Jun. 4, 2008, 5 pages.

Tran, X., et al., "Design-for-Test of Asynchronous Networks-on-Chip", Design and Diagnostics of Electronic Circuits and systems, IEEE, 2006, pp. 161-165.

Su, M., et al., "A General Method to Make Multi-Clock System Deterministic", Design, Automation & Test in Europe Conference & Exhibition (DATE), EDAA, 2010, pp. 1480-1485.

Verma, S., et al., "Understanding Clock Domain Crossing Issues: Asynchronous Clock Domain", http://www.eetimes.com/General/DisplayPrintViewContent?contentltemld=4018520, EE Times, Dec. 24, 2007, pp. 1-17.

Feng, Y., et al., "Clock Domain Crossing Fault Model and Coverage Metric for Validation of SoC Design", Dept. of Computer Science, Peking University, EDAA, 2007, pp. 1385-1390.

* cited by examiner

AUTOMATIC GENERATION OF VALID AT-SPEED STRUCTURAL TEST (ASST) TEST GROUPS

FIELD OF THE INVENTION

The invention relates to generating test groups for at-speed structural test (ASST) and, more particularly, to systems and methods for automatic generation of test groups of clock domains for ASST.

BACKGROUND

Integrated circuit designs require testing to ensure proper functioning of all logic components. However, as the size and number of the logic components on the integrated circuit continues to increase, the number of multiple clocks activating the logic components has also increased.

In typical integrated circuit designs, a clock domain is defined as a set of memory components, e.g., flip-flops, registers, synchronous RAM, etc. The clock domains may exchange data, and the point at which the clock domains exchange the data may be referred to as a clock domain crossing. Clock domains that exchange data need to be interfaced and synchronized in reliable and predictable manners to ensure the proper transfer of data from one clock domain to another.

One method for testing the clock domains to ensure the proper transfer of data from one clock domain to another is to test each clock domain one at a time. However, this method can be very inefficient, time consuming, and costly, especially considering that the number of the logic components and clock domains on the integrated circuit continues to increase in modern integrated circuit designs.

Therefore, in order to achieve efficient testing of clock domains of the integrated circuit design, the clock domains are typically grouped into test groups. A test group is a group of domains that can be physically tested together. The test groups are manually generated by a clock designer per predetermined guidelines. The number of test groups generated by the clock designer is generally kept as small as possible in order to minimize the test time and cost. Nonetheless, the manual grouping of the clock domains is tedious, time consuming, and error prone.

For example, asynchronous domains may fail on a tester if they communicate with one another. Therefore, if asynchronous domains are placed in the same test group the integrated chip may be falsely indicated as failing. Furthermore, in a test group, there are additional constraints driving the separation of certain clocking elements that could increase noise if tested together, e.g., clocking elements may not be intended to be tested together because they create noise from too many switches being performed in the same area or domain of the integrated circuit.

Additional problems associated with or resultant from the manual grouping of clock domains include: (1) the fact that the designer for the integrated circuit may forget to list synchronous domains, or asynchronous domains that are independent, and thus potentially resulting in the improper grouping of domains; (2) timing tools typically do not list the domain crossings; (3) the grouping of multiple phase locked loops (PLLs) in a same test group may cause characterization issues, e.g., voltage speed; and (4) the grouping of multiple PLLs makes it harder to synchronize to a single tester reference clock oscillator on or off the integrated circuit.

Accordingly, there exists a need in the art to overcome the deficiencies and limitations described hereinabove.

SUMMARY

In a first aspect of the invention, a method is provided for automatically generating valid at speed structural test (ASST) test groups. The method comprises loading a netlist for an integrated circuit into a processor. The method further comprises determining a plurality of clock domain crossings between a plurality of clock domains within the integrated circuit. The method further comprises generating a first test group. The method further comprises adding a first clock domain of the plurality of clock domains to the first test group. The method further comprises adding a second clock domain of the plurality of clock domains to the first test group when the second clock domain does not have a clock domain crossing into the first clock domain.

In another aspect of the invention, a computer system is provided for automatically generating valid at speed structural test (ASST) test groups. The system comprises a CPU, a computer readable memory and a computer readable storage media. The system further comprises first program instructions to load a netlist for an integrated circuit into a processor. The system further comprises second program instructions to determine a plurality of clock domain crossings between a plurality of clock domains within the integrated circuit. The system further comprises third program instructions to generate a first test group. The system further comprises fourth program instructions to add a first clock domain of the plurality of clock domains to the first test group. The system further comprises fifth program instructions to add a second clock domain of the plurality of clock domains to the first test group when the second clock domain does not have a clock domain crossing into the first clock domain. The system further comprises the first through fifth program instructions being stored on the computer readable storage media for execution by the CPU via the computer readable memory.

In yet another aspect of the invention, a method is provided for automatically generating valid at speed structural test (ASST) test groups. The method further comprises generating a hash table from at least one clock crossing list. The method further comprises parsing the hash table for each clock domain identified in the at least one clock crossing list. The method further comprises matching each parsed clock domain to a test group using a processor and based on at least one test group rule.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to generating test groups for at-speed structural test (ASST) and, more particularly, to systems and methods for automatic generation of test groups of clock domains for ASST. More specifically, implementations of the invention provide a system and method for automatic generation of test groups for multiple clock domains based on predetermined rules. In embodiments, a domain-specific table is generated that accounts for domain crossings and the frequency of clocks within the domain such that the domain specific table may be parsed and test groups may be auto-generated based on the predetermined rules for the integrated circuit. Advantageously, the system and method for automatic generation of test groups for ASST avoids the significant time and cost incurred by the manual process of test group generation. Also, advantageously, the system and method for automatic generation of test groups for ASST improves performance of ASST by providing smaller numbers of test groups as compared to the manual process. Additional advantages include the ability of providing a more efficient and less error prone means of generating test groups when a netlist has many clock domains and many clock crossing violations.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1:
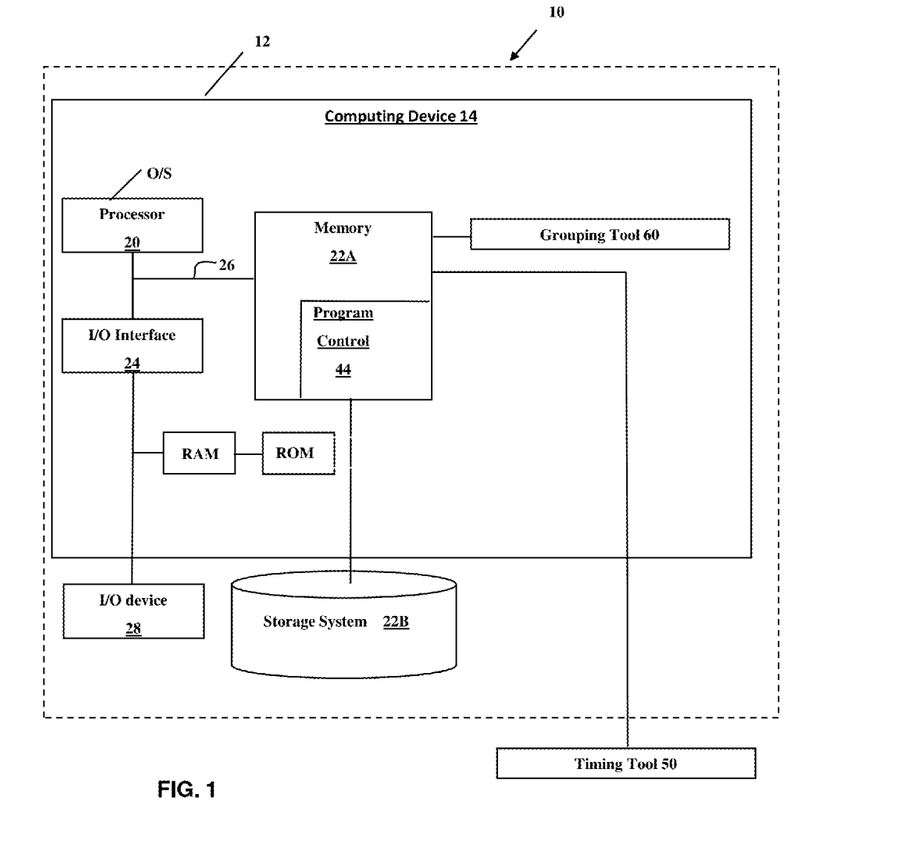
FIG. 1 is an illustrative external environment for implementing the invention in accordance with aspects of the invention.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard, etc.

In general, the processor 20 executes computer program code (e.g., program control 44), which can be stored in the memory 22A and/or storage system 22B. Moreover, in accordance with aspects of the invention, the program control 44 controls a timing tool 50 and a grouping tool 60 to perform the processes described herein. The timing tool 50 and the grouping tool 60 can be implemented as one or more program code in the program control 44 stored in memory 22A as separate or combined modules. Additionally, the timing tool 50 and the grouping tool 60 may be implemented as separate dedicated processors or a single or several processors to provide the function of this tool. While executing the computer program code, the processor 20 can read and/or write data to/from memory 22A, storage system 22B, and/or I/O interface 24. The program code executes the processes of the invention. The bus 26 provides a communications link between each of the components in the computing device 14.

In embodiments, the timing tool 50 and the grouping tool 60 can be used to provide the auto-generated grouping of the clock domains. For example in accordance with aspects of the invention, the timing tool 50 can identify domain crossings within an integrated circuit design. The identified domain crossings can then be used by the grouping tool 60 to create a clock domain specific hash table, which can then be parsed in order to match clock domains of the integrated circuit design with test groups based on predefined rules for the integrated circuit design.

Flow Diagram

Figure 2:
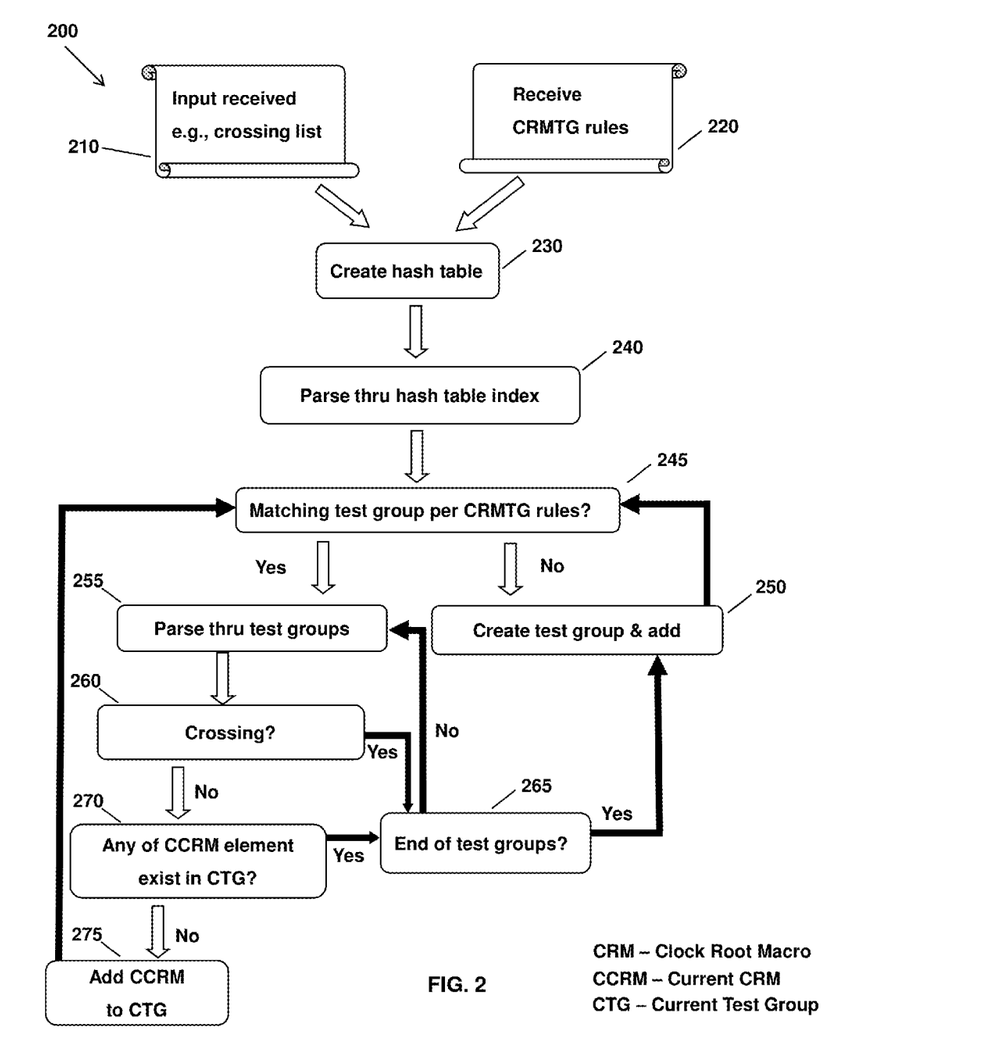
FIG. 2 is an illustrative process flow of implementing the system in accordance with aspects of the invention.

FIG. 2 shows an exemplary flow for performing aspects of the present invention. The steps of FIG. 2 may be implemented in the environment of FIG. 1, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

In embodiments, as shown in FIG. 2, a method 200 for automatic generation of test groups of clock domains for ASST is provided. At step 210, input may be generated and received, which is used for automatic generation of the test groups of clock domains. In accordance with aspects of the invention, the input may comprise a netlist for the integrated circuit design, e.g., a design-for-test (DFT) ready integrated circuit netlist, and a list or report of domain crossings. In embodiments, the list of domain crossings may be obtained from a timing tool, e.g., timing tool 50. The timing tool 50 may identify timing clock groups, propagate clock phase on latch-to-latch paths between clock groups, and find timing tests between clock groups. Optionally, the input may further comprise functional clock data, e.g., functional clock domains, PLLs, domain clock frequencies, noise characterization, and/or preliminary test groups.

At step 220, predetermined rules, e.g., clock root macro test group (CRMTG) rules, may be generated and received. In accordance with aspects of the invention, the CRMTG rules may comprise at least one condition that should be satisfied in order for multiple clock domains to be tested together in a group. For example, the at least one condition may include: (i) for synchronous domains, if the domains have the same frequency and there is no cross talk or there is cross talk, then the domains may be grouped together; (ii) for asynchronous domains, if there is cross talk between the domains, then the domains should be in different test groups; (iii) for asynchronous domains, if the domains have a different frequency and no cross talk, then the domains may be in the same test group; (iv) for asynchronous domains, if the domains have the same frequency and no cross talk, then the domains may be in the same test group; and (v) for synchronous domains, if the domains have different frequencies, then the domains must be in different test groups.

In embodiments, the at least one condition of the CRMTG rules may include: (i) analog cores of different types must be in different test groups for debugging purposes, e.g., HSS6G and HSS11G, must be in a different test group; and (ii) analog cores and deskewers cannot be in the same group due to noise limitations during testing. In accordance with aspects of the invention, excessive noise during hardware testing may invalidate test results, resulting in excessive yield loss.

At step 230, a domain specific table may be generated for the integrated circuit design. In accordance with aspects of the invention, the domain specific table may be a hash table generated by the grouping tool 60. The hash table may account for the domain crossings and frequencies of the clocks in the integrated circuit design. For example, for each clock domain or clock root macro (CRM), all other clock domains at issue with a clock domain are added to the table under the clock domain. In embodiments, each crossing list or report may be transformed into an array of clock domains as an Index and the clock domains that communicate with the clock domains as Elements. Accordingly, each clock domain or CRM (e.g., A, B, C, and D) is listed as their own Index, and if clock domain (C) is in communication with clock domain (A), then clock domain (C) may also be listed under clock domain (A) as an Element. In accordance with aspects of the invention, each clock domain in the crossing list or report is processed in a loop and listed as an Index until a final Index for a final clock domain is processed.

At step 240, the hash table may be parsed to separate the clock domains. For example at step 245, the process of parsing through the hash table may start by selecting a clock domain (A) and determining whether there is any noise and/or analog cores grouping constraints based on the CRMTG rules between domain (A), which is identified as the current clock root macro (CCRM), and any existing test groups. If there is a constraint between CCRM (A) and all existing test groups, then at step 250 a new test group may be generated, and the CCRM (A) is added to the new test group. If there are no constraints then at step 255 each existing test group may be parsed through and compared to the CCRM based upon the CRMTG rules.

For example, at step 260, a check may be performed to determine whether there is any crossings between the CCRM (A) and a current test group (CTG). If there is a crossing between the CCRM (A) and the CTG, then a check is run at step 265 to determine whether the CTG is the last test group available. If the CTG is the last test group available, then at step 250 a new test group may be generated, and the CCRM (A) is added to the new test group. If the CTG is not the last test group, then at step 255 another test group that has not been previously compared to the CCRM (A) becomes the CTG, and a crossing check is again performed at step 260.

If the CTG does not have a crossing with the CCRM (A), then at step 270 a determination is made as to whether there are any CCRM Elements present in the CTG. For example, if a CCRM (C) has an Element (H) listed under it in the hash table because of a communication link between (C) and (H), and the CCRM (A) has a crossing issue with Element (H) also listed under it in the hash table, then CCRM (A) could not be added to the CTG comprising CCRM (C) because the communication link between CCRM (C) and Element (H) could potentially cause an issue with CCRM (A). Accordingly, a check is performed at step 265 to determine whether the CTG is the last test group available. If the CTG is the last test group available, then at step 250 a new test group may be generated, and the CCRM (A) is added to the new test group. If at step 270 the CTG does not have any CCRM Elements in conflict with the CCRM, then the CCRM is added to the CTG at step 275. Thereafter, the process may proceed back to step 245, select a new clock domain (B), and continue through the process of steps 245-275 until the entire Index of clock domains have been placed into test groups.

Therefore, in accordance with aspects of the invention and the processes illustrated in FIG. 2, each clock domain type is grouped into a separate CRMTG based on the CRMTG rules such that all types of functional clock domains can be grouped into one CRMTG. The functional clock domains grouped under each CRMTG can then be simultaneously analyzed for grouping constraints. Advantageously, this process for automatic generation of test groups for ASST avoids the significant time and cost incurred by the manual process of test group generation and improves performance of ASST by providing smaller numbers of test groups as compared to the manual process.

Figure 3:
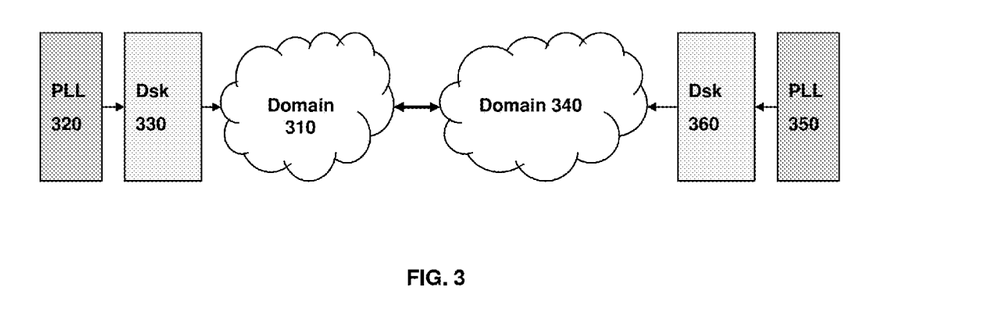
FIG. 3 is an illustration that shows an example of an asynchronous domain.
Figure 4:
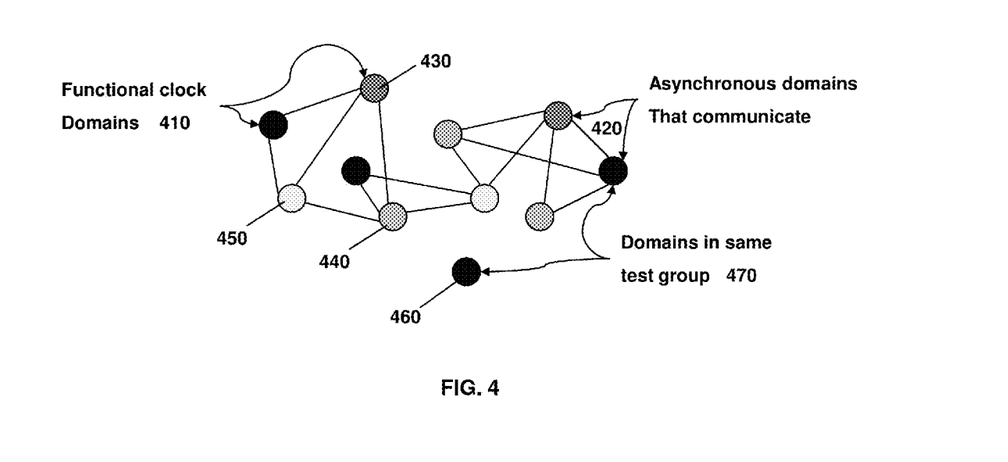
FIG. 4 is an illustration that shows a graph coloring or shading solution for generating test groups.

Based on the above exemplary CRMTG rules and by way of illustration in FIGS. 3 and 4, for domains that are asynchronous, the domains may be in the same test group only if there is no cross talk (e.g., data paths) between them, and for domains that are synchronous, the domains may be in the same test group only if the domains have the same frequencies. As shown in FIG. 3, domain 310 of 250 MHz is driven by PLL 320 through deskewer 330 (e.g., logic used to divide clocks), and domain 340 of 333 MHz is driven by PLL 350 through deskewer 360. These two domains 310 and 340 are asynchronous and therefore can only be in the same test group if there are no data paths between them.

As shown in FIG. 4, a graph shading solution can be used to minimize test groups. For example, each node 410 is a functional clock domain, and incompatible clock domains have an edge 420 between them. The nodes 410 are provided with different coloring or shading 430, 440, 450, and 460 such that no two nodes having an edge between them have the same color or shading, and the number of colors or shades used is minimized. In other words, by minimizing the coloring or shading, the number of test groups 470 may be minimized.

Figure 5:
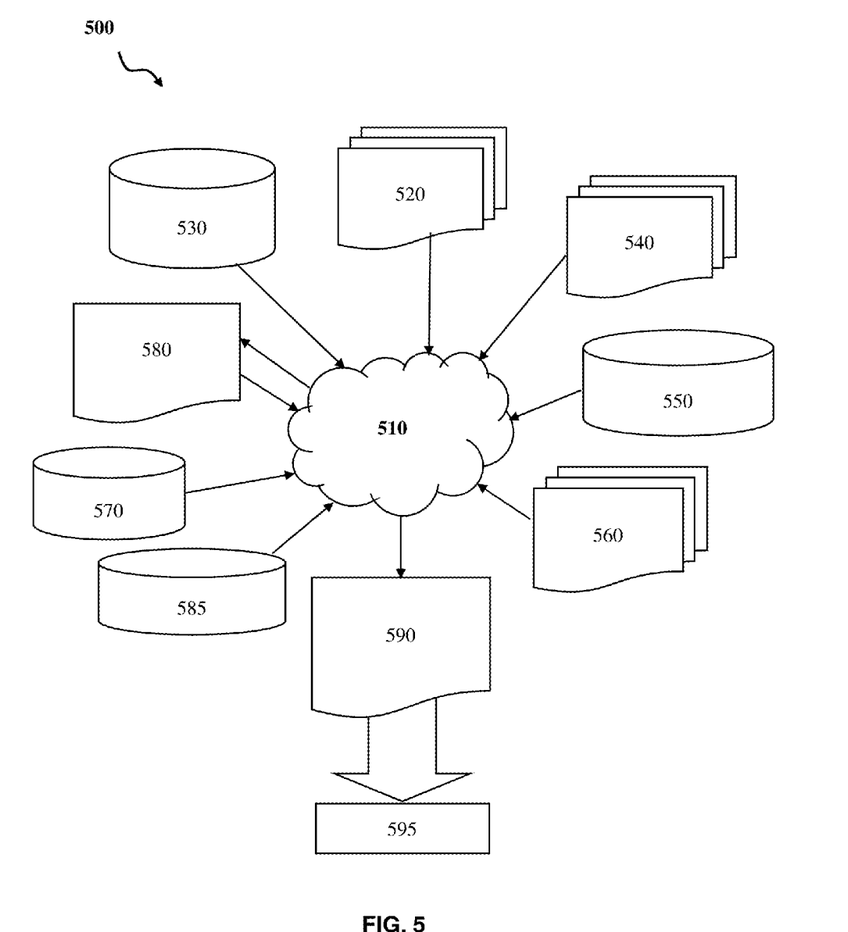
FIG. 5 is a flow diagram of a design process used in semiconductor design, manufacture, and/or test.

FIG. 5 is a flow diagram of a design process used in semiconductor design, manufacture, and/or test used with the system and method of the present invention. FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system, which can be implemented with the method and system of the present invention. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590.

Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more devices. In one embodiment, design structure 590 may comprise a compiled, executable HDL simulation model that functionally simulates the devices.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 590 may then proceed to a stage 595 where, for example, design structure 590: proceeds to tape-out, is released to manufacturing, is released to a mask house, is sent to another design house, is sent back to the designer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method for automatically generating valid at speed structural test (ASST) test groups, comprising:
    loading a netlist for an integrated circuit into a processor, the netlist comprising a crossing list for a plurality of clock domains;
    generating a domain specific table using the crossing list to arrange each clock domain of the plurality of clock domains as an index and each clock domain of the plurality of clock domains that communicate with each index as elements of the index;
    determining there is no domain crossings between a first clock domain of the plurality of clock domains and one or more of the plurality of clock domains associated with a first ASST test group using the crossing list;
    determining there is one or more of the elements within the first ASST test group using the domain specific table;
    determining there is no domain crossings between the first clock domain and the one or more of the elements within the first ASST test group using the domain specific table; and
    adding the first clock domain of the plurality of clock domains to the first ASST test group,
    wherein at least the step of generating the domain specific table is performed using the processor.

2. The method of claim 1, further comprising generating a second ASST test group when the first clock domain has a domain crossing into the one or more of the plurality of clock domains associated with the first ASST test group, and adding the first clock domain to the second ASST test group.

3. The method of claim 2, further comprising repeating an addition of clock domains until each clock domain of the plurality of clock domains is added to an ASST test group to generate a plurality of ASST test groups for the ASST.

4. The method of claim 1, wherein the generating the domain specific table comprises transforming the netlist into a list of each index of the plurality of clock domains and associated elements of clock domains that communicate with each clock domain of the plurality of clock domains.

5. The method of claim 4, wherein the domain specific table is a hash table comprising the index and the elements.

6. The method claim 5, further comprising processing each index of the plurality of clock domains, wherein the processing of each index comprises determining a plurality of domain crossings between the plurality of clock domains within the integrated circuit.

7. The method of claim 6, wherein the processing each index further comprises:
    determining whether there is at least one noise and analog core grouping constraint between the first clock domain and one or more of the plurality of clock domains associated with the first ASST test group; and
    generating a second ASST test group when the first clock domain has the at least one noise and analog core grouping constraint, and adding the first clock domain to the second ASST test group.

8. The method of claim 7, further comprising determining whether any conflicts exist between elements associated with a second clock domain and the first clock domain in the first ASST test group, and adding the second clock domain to the first ASST test group when a conflict does not exist.

9. A computer system automatically generating valid at speed structural test (ASST) test groups, the system comprising:
    a CPU, a computer readable memory and a computer readable storage media;
    program instructions to load a netlist for an integrated circuit into a processor, the netlist comprising a crossing list for a plurality of clock domains;
    program instructions to determine there is no domain crossings between a first clock domain of the plurality of clock domains and one or more of the plurality of clock domains associated with a first ASST test group using the crossing list, wherein each clock domain of the plurality of clock domains is arranged within a domain specific table as an index and each clock domain of the plurality of clock domains that communicate with each index is arranged as an element of the index within the domain specific table;
    program instructions to determine there is one or more of the elements within the first ASST test group using the domain specific table;
    program instructions to determine there is no domain crossings between the first clock domain and the one or more of the elements within the first ASST test group using the domain specific table; and
    fourth program instructions to add the first clock domain of the plurality of clock domains to the first ASST test group,
    wherein the program instructions are stored on the computer readable storage media for execution by the CPU via the computer readable memory.

10. The computer system of claim 9, further comprising program instructions to generate a second ASST test group when the first clock domain has a domain crossing into the one or more of the plurality of clock domains associated with the first ASST test group, and add the first clock domain to the second ASST test group.

11. The computer system of claim 10, further comprising program instructions to repeat adding clock domains until each clock domain of the plurality of clock domains is added to an ASST test group to generate a plurality of ASST test groups for the ASST.

12. The computer system of claim 9, wherein the generating the domain specific table comprises transforming the netlist into a list of each index of the plurality of clock domains and associated elements of clock domains that communicate with each clock domain of the plurality of clock domains.

13. The computer system of claim 12, wherein the domain specific table is a hash table comprising the index and the elements.

14. The computer system of claim 13, further comprising program instructions to process each index of the plurality of clock domains, wherein the processing of each index comprises determining a plurality of domain crossings between the plurality of clock domains within the integrated circuit.

15. The computer system of claim 14, wherein the program instructions to process each index further comprises instructions to:
    determine whether there is at least one of noise and analog core grouping constraint between the first clock domain and one or more of the plurality of clock domains associated with a first ASST test group; and generate a second ASST test group when the first clock domain has the at least one noise and analog core grouping constraint, and add the first clock domain to the second ASST test group.

16. The computer system of claim 15, further comprising program instructions to determine whether any conflicts exist between elements associated with a second clock domain and the first ASST clock domain in the first test group, and adding the second clock domain to the first ASST test group when a conflict does not exist.

17. A method for automatically generating valid at speed structural test (ASST) test groups, comprising:

generating a hash table from at least one clock crossing list to arrange each clock domain of a plurality of clock domains as an index and each clock domain of the plurality of clock domains that communicate with each index as elements of the index;

parsing the hash table for each clock domain identified in the at least one clock crossing list to separate each index and associated elements;

determining there is no domain crossings between a first clock domain of the plurality of clock domains and one or more of the plurality of clock domains associated with a first ASST test group using the at least one clock crossing list;

determining there is one or more of the elements within the first ASST test group using the hash table;

determining there is one or more domain crossings between the first clock domain and the one or more of the elements within the first ASST test group using the hash table;

in response to determining there is one or more domain crossings between the first clock domain and the one or more of the elements, generating a second ASST test group; and adding the first clock domain to the second ASST test group, wherein at least the step of generating the hash table is performed using a processor.

18. The method of claim 17, further comprising:

determining whether there is at least one noise and analog core grouping constraint between the first clock domain, which is identified as a current clock root macro (CCRM), and any existing ASST test groups;

when there is a constraint between the CCRM and all existing test groups, generating the second ASST test group and adding the CCRM to the second ASST test group; and when there are no constraints between the CCRM and any existing test groups, parsing each existing test group and comparing the CCRM to each existing test group including the first ASST test group based on at least one test group rule.

19. The method of claim 18, further comprising:

checking whether there is any domain crossing between the CCRM and the first ASST test group, which is identified as a current test group (CTG);

when there is a domain crossing between the CCRM and the CTG, determining whether the CTG is a last test group available;

when the CTG is the last test group available, generating the second ASST test group and adding the CCRM to the second ASST test group;

when the CTG is not the last test group, comparing the CCRM to another ASST test group;

performing a domain crossing check between the CCRM and the another ASST test group; and when the CTG or the another test group does not have a domain crossing with the CCRM, determining whether there are any CCRM elements present in the CTG.

20. The method of claim 19, further comprising:

determining there is no domain crossings between the CCRM and any of the CCRM elements present in the CTG;

adding the CCRM to the CTG.

* * * * *